(12) United States Patent
Chen et al.

(10) Patent No.: US 8,266,487 B2
(45) Date of Patent: Sep. 11, 2012

(54) CODING A SIGNAL

(75) Inventors: Hongyuan Chen, Tokyo (JP); Kodo Shu, Kawasaki (JP)

(73) Assignee: Nokia Corporation, Espoo (FI)

( * ) Notice: Subject to any disclaimer, the term of this patent is extended or adjusted under 35 U.S.C. 154(b) by 690 days.

(21) Appl. No.: 12/438,666

(22) PCT Filed: Aug. 24, 2006

(86) PCT No.: PCT/FI2006/050364
§ 371 (c)(1), (2), (4) Date: Feb. 24, 2009

(87) PCT Pub. No.: WO2008/023085
PCT Pub. Date: Feb. 28, 2008

(65) Prior Publication Data
US 2009/0254789 A1 Oct. 8, 2009

(51) Int. Cl.
*G06F 11/00* (2006.01)
*G06F 11/30* (2006.01)
*G08C 25/00* (2006.01)
*H03M 13/00* (2006.01)
*H04L 1/00* (2006.01)

(52) U.S. Cl. .................. 714/746; 714/758
(58) Field of Classification Search .......... None
See application file for complete search history.

(56) References Cited

U.S. PATENT DOCUMENTS

| 6,823,022 B1 * | 11/2004 | Fullerton et al. ........... 375/285 |
| 2007/0005749 A1 * | 1/2007 | Sampath ..................... 709/223 |
| 2007/0150784 A1 * | 6/2007 | Pan et al. .................... 714/746 |
| 2008/0144493 A1 * | 6/2008 | Yeh ............................ 370/230 |
| 2009/0143070 A1 | 6/2009 | Shu et al. |
| 2011/0132438 A1 | 6/2011 | Pasanen et al. ............. 136/252 |

FOREIGN PATENT DOCUMENTS

| JP | 7059151 A | 3/1995 |
| JP | 2001257604 A | 9/2001 |
| WO | 9833346 A2 | 7/1998 |
| WO | WO 2006/077450 A1 | 7/2006 |

OTHER PUBLICATIONS

International Search Report and Written Opinion received in corresponding Patent Cooperation Treaty Application No. PCT/FI2006/050364, dated May 2, 2007, 13 pages.

* cited by examiner

*Primary Examiner* — Guerrier Merant
(74) *Attorney, Agent, or Firm* — Harrington & Smith (57) ABSTRACT

An apparatus, a base station and user equipment are provided. The apparatus is configured to code a first given number of symbols from the beginning of a transmission period and/or a second given number of symbols from the end of the transmission period with a stronger error correcting code than the rest of the symbols in the transmission period.

16 Claims, 4 Drawing Sheets

CODING A SIGNAL

RELATED APPLICATIONS

This application was originally filed as PCT Application No. PCT/FI2006/050364 filed Aug. 24, 2006.

FIELD OF THE INVENTION

The invention relates to coding a signal comprising symbols.

BACKGROUND

One of the key problems in constructing and maintaining communications systems is the limited scope of available transmission resources. This applies to communication systems utilizing wireless connections, in particular. In a wireless communication system, the usage of radio spectrum must be planned in detail. Careful planning of the use of radio frequencies aims at utilizing the available frequencies as efficiently as possible but simultaneously at minimizing co-channel interference and adjacent channel interference. By means of various models, available frequencies are divided into different cells so as to minimize the interference occurring in radio connections and thus maximize the network capacity. In a cell repeat pattern, the same or adjacent frequencies must not be too close to one another, because this causes excessive interference in the system.

On the other hand, a tight frequency reuse pattern is attractive because of the efficient usage of the frequencies. Solutions with a tight frequency reuse have been proposed for future wireless communications systems. In order to reduce co-channel interference and inter-cell interference, transmission level controlled by a power sequence may be applied to a base station. Adjacent base stations may use different power sequences to avoid instant over lapping in coverage.

The efficient use of power sequences requires that base stations be synchronized. The accuracy of synchronization of power sequences among adjacent base stations and delay variations of co-channel interferences from nearby base stations will affect the signal quality at receiving user equipment during power-level transitions. Errors in synchronization may cause situations where adjacent base stations transmit with a high power level using frequencies that are near each other or even the same. In such a case, the interference level at the receiving user equipment is very high. During the period of high interference, the symbols contained in the received signal may be lost.

BRIEF DESCRIPTION OF THE INVENTION

An object of the invention is to provide a solution for coding a signal and controlling the transmission of a signal. According to an aspect of the invention, there is provided a method, comprising: coding at least one of the following: a first given number of symbols from the beginning of a transmission period, a second given number of symbols from the end of the transmission period with a stronger error correcting code than the rest of the symbols in the transmission period.

According to another aspect of the invention, there is provided an apparatus, configured to code at least one of the following: a first given number of symbols from the beginning of a transmission period, a second given number of symbols from the end of the transmission period with a stronger error correcting code than the rest of the symbols in the transmission period.

According to another aspect of the invention, there is provided a base station of a communication system, the base station comprising a coder configured to code at least one of the following: a first given number of symbols from the beginning of a transmission period, a second given number of symbols from the end of the transmission period with a stronger error correcting code than the rest of the symbols in the transmission period.

According to another aspect of the invention, there is provided an integrated circuit, comprising: a coder configured to code at least one of the following: a first given number of symbols from the beginning of a transmission period, a second given number of symbols from the end of the transmission period with a stronger error correcting code than the rest of the symbols in the transmission period.

According to another aspect of the invention, there is provided a computer program product encoding a computer program of instructions for executing a computer process for coding a signal, the signal comprising symbols, the process comprising: coding at least one of the following: a first given number of symbols from the beginning of a transmission period, a second given number of symbols from the end of the transmission period with a stronger error correcting code than the rest of the symbols in the transmission period.

According to another aspect of the invention, there is provided a computer program distribution medium readable by a computer and encoding a computer program of instructions for executing a computer process for coding a signal, the signal comprising symbols, the process comprising: coding at least one of the following: a first given number of symbols from the beginning of a transmission period, a second given number of symbols from the end of the transmission period with a stronger error correcting code than the rest of the symbols in the transmission period.

According to another aspect of the invention, there is provided an apparatus, configured to: determine a first interfering period from the beginning of a transmission period, determine a second interfering period from the end of the transmission period, refrain from transmitting during at least one of the determined interfering periods.

According to yet another aspect of the invention, there is provided a method, comprising: determining a first interfering period from the beginning of a transmission period, determining a second interfering period from the end of the transmission period, refraining from transmitting during at least one of the determined interfering periods.

According to yet another aspect of the invention, there is provided a computer program distribution medium readable by a computer and encoding a computer program of instructions for executing a computer process for controlling the transmission of a signal, the process comprising: determining a first interfering period from the beginning of a transmission period, determining a second interfering period from the end of the transmission period, refraining from transmitting during at least one of the determined interfering periods.

Embodiments of the invention provide several advantages. Due to unequal error protection, the loss of symbols during high interference periods is avoided. Embodiments of the invention may be applied to systems where tight frequency reuse and power sequence controlled transmission power are utilized. In such systems, the requirement of power sequence synchronization between adjacent base stations may be eased. However, embodiments of the invention may be applied to other systems as well. For example, periods of increased interference may occur due to time difference caused by the difference of distances from user equipment to several adjacent base stations. In general, the applied unequal error protection improves network throughput.

BRIEF DESCRIPTION OF THE DRAWINGS

In the following, the invention will be described in greater detail with reference to the embodiments and the accompanying drawings, in which.

DETAILED DESCRIPTION OF THE DRAWINGS

Figure 1:
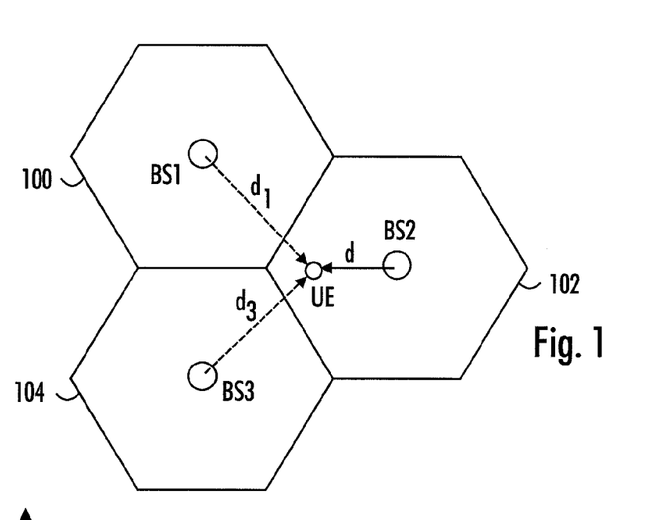
FIG. 1 shows an example of a communication system to which embodiments of the invention can be applied.

With reference to FIG. 1, examine an example of a communication system to which embodiments of the invention can be applied. FIG. 1 illustrates three base stations BS1, BS2 and BS3 of a cellular system. Base station BS1 serves cell 100, base station BS 2 serves cell 102 and base station BS3 serves cell 104. User equipment UE in cell 102 is communicating with base station BS2. The user equipment is at distance d from base station BS2. The distances between the user equipment and base stations BS1 and BS3 are $d_1$ and $d_3$.

In the system of FIG. 1, a frequency reuse factor is one. Thus, the same frequencies are used in all cells. Assume that base station BS2 is transmitting to user equipment UE on a given frequency F. Base stations BS1 and BS3 are using the same frequency F in their the transmissions to the user equipment in cells 100 and 104. The user equipment in cells 100, 104 are not shown in FIG. 1 for the sake of clarity.

In the system of FIG. 1, power sequence controlled transmission power is utilized. Thus, the transmission power of each base station is controlled according to a power sequence. The power sequences are selected such that only one base station of adjacent base stations using the same frequency is transmitting at a high power level at any given time.

Figure 2:
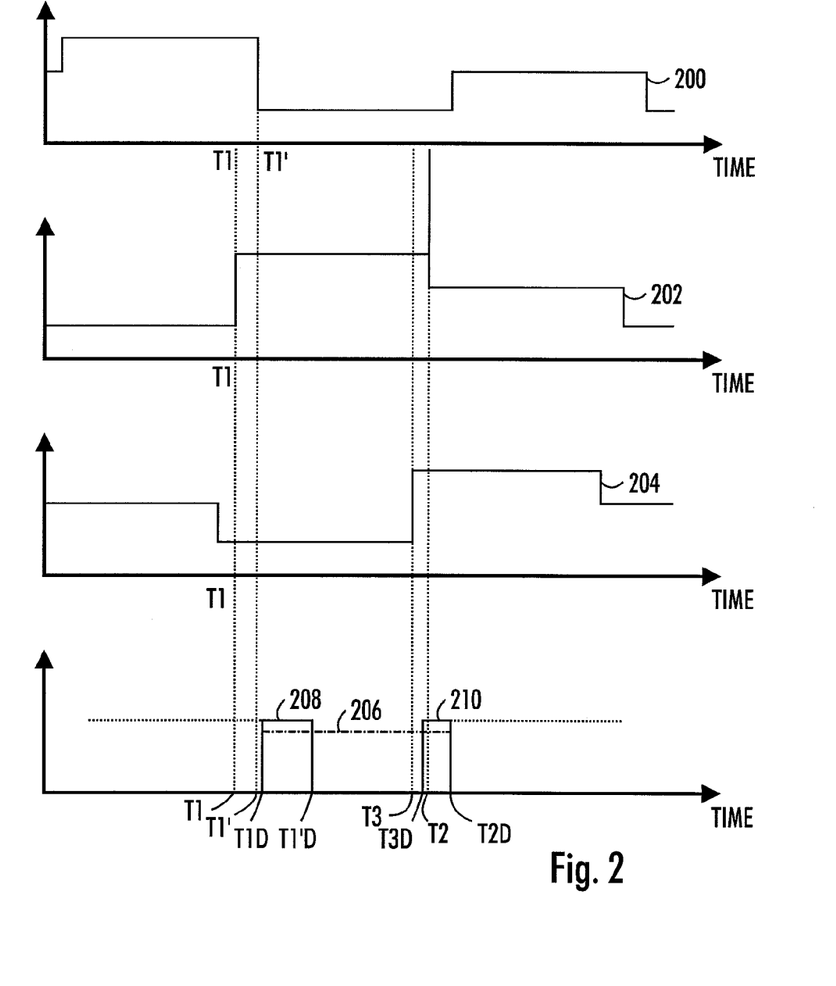
FIG. 2 illustrates power sequences and the effect the inaccuracies in power sequence synchronization and signal propagation delays have on interference experienced by user equipment.

FIG. 2 illustrates the power sequences and the effect the inaccuracies in power sequence synchronization and signal propagation delays have on interference experienced by user equipment UE. In FIG. 2, graph 200 illustrates the transmission power of base station BS 1. Respectively, graphs 202 and 204 illustrate the transmission powers of base stations BS2 and BS3. The lowest graph illustrates signal interference experienced by UE. The power sequences of the base stations are synchronized. Thus, the transmission power of each base station should change at the same time instant.

At time instant T1, the transmission power levels of base stations BS1 and BS2 should change. BS1 should change the transmission power level from a high value to a lower value. BS2 should start transmitting with a high power value. However, because of an error in synchronization, the transmission power level of BS1 transits from a high power level to a lower level at time instant T1'.

Base station BS2 starts transmitting a frame format signal with symbols with a high power level to user equipment UE at time instant T1. User equipment UE starts receiving the transmission of BS2 at time instant T1D. Due to propagation delay, T1D>T1. The propagation delay is a function of the distance d. The propagation delay between BS1 and UE is larger than between BS2 and UE due to the distance $d_1$, which is greater than d. Thus, UE receives the transmission of BS1 until time instant T1'D. From the UE point of view, the transmission of BS1 is co-channel interference. Thus, from time instant T1D to time instant T1'D, the interference situation is severe because BS1 is transmitting at a high power level. Time instant T1D depends upon distance d and time instant T1'D depends upon distance $d_1$ and the synchronization error between BS1 and BS2.

A similar situation may occur when the transmission of BS2 transits from a high power level to a lower level. This happens at time instant T2. At the same time instant, base station BS3 should start transmitting at a high power level. However, due to a synchronization error between BS2 and BS3, base station BS3 starts transmitting already at time instant T3, where T3<T2. The propagation delay between BS3 and UE is larger between BS3 and UE due to the distance $d_3$, which is greater than $d_2$. Thus, UE receives the high power transmission of BS3 at time instant T3D. The desired transmission of BS2 ends at time instant T2D. Thus, from time instant T3D to time instant T2D, the interference situation is severe because BS3 is transmitting at a high power level. Time instant T2D depends upon distance d and time instant T3D depends upon distance $d_3$ and the synchronization error between BS2 and BS3.

The lowest graph of FIG. 2 illustrates the interference periods experienced by user equipment UE. The desired transmission 206 from BS2 occurs between time instants T1D and T2D. At the beginning of the desired transmission there is a first interference period 208 between time instants T1D and T1'D. The interference is due to the transmission 200 of base station BS1. At the end of the desired transmission there is a second interference period 210 between time instants T3D and T2D. The interference is dues to the transmission 204 of base station BS3.

In the interference periods, the user equipment experiences a low signal-to-interference ratio (SIR). In the above example, the interference periods were due to the synchronization error or the clock inaccuracy between the adjacent base stations and propagation delay variations. The clock inaccuracy may depend on the stability and the resolution of the clocks in the base stations. It may also depend on the interval between two consecutive synchronizations of the clocks. In a power sequence system, the relative clock accuracy between any two adjacent base stations is important.

Let the maximum clock error caused by clock inaccuracy between the serving BS (base station BS2 in the above example) and the i:th adjacent BS be $E_i$ microseconds (μs).

For simplicity, assume that there are direct paths between UE and nearby base stations. Multi-path propagation is not taken into account. The delay variations in the signal propagation times between nearby base stations and user equipment depend on the differences between the distances from the user equipment to nearby base stations. Let d be the distance from the user equipment to its serving base station in meters and $d_i$ be the distance from the user equipment to the i:th interfering base station in meters. Thus, the delay variation in microseconds can be obtained by the following equation.

$$D_i = \frac{d_i - d}{300}. \quad (1)$$

The maximum length for the first interfering period for UE at the beginning of power level transition (from T1D to T1'D in FIG. 2) is given by the equation:

$$ISmax = \max\{(E_i + D_i)\} \text{ in } \mu s \quad (2)$$

The above equation calculates the maximum time period for user equipment that a serving base station should consider as a heavily interfering period, starting from the time instant when the serving base stations starts transmitting at a high power level.

In a similar manner, the maximum length for the second interfering period for UE at the end of power level transition (from T3D to T2D in FIG. 2) is given by the equation:

$$IEmax = \max\{(E_i - D_i)\} \text{ in } \mu s \quad (3)$$

The above parameters may be determined in a serving base station or another network element on the basis of measurements made by base stations and/or user equipment. The user equipment may signal measurement information to the serving base station using a control channel, for example.

Figure 3:
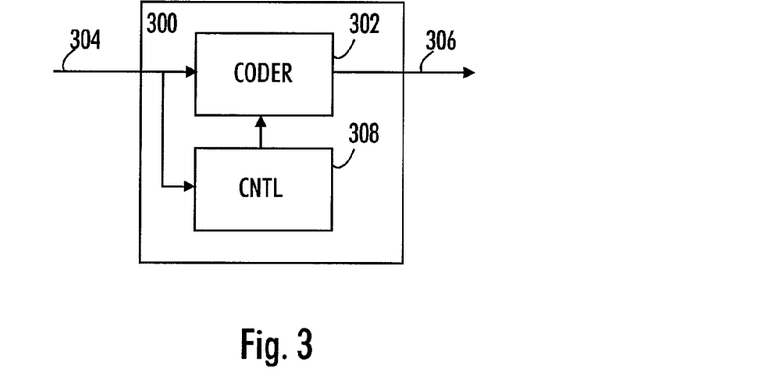
FIG. 3 illustrates an apparatus to which embodiments of the invention can be applied.
Figure 4:
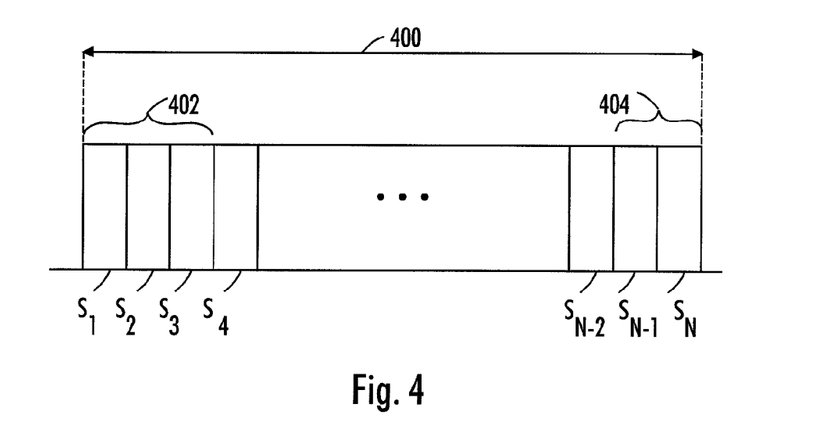
FIG. 4 illustrates an example of an input signal of the apparatus of FIG. 3.

FIGS. 3 and 4 illustrate an embodiment of the invention. FIG. 3 illustrates an apparatus 300 comprising a coder 302. The coder is configured to code an input signal 304 and produce as an output 306 a coded signal. FIG. 4 illustrates an example of the input signal 304 of the coder. The signal 304 comprises a transmission period 400 with a given number of having symbols $S_1, S_2, \ldots, S_{N-2}, S_{N-1}$, and $S_N$ The coder is configured to code a first given number of symbols from the beginning of a transmission period with a stronger error correcting code than the rest of the symbols in the transmission period. Respectively, a second given number of symbols from the end of the transmission period may be coded with a stronger error correcting code than the rest of the symbols in the transmission period. Thus, the first and/or the last symbols of the transmission may be protected more efficiently than the symbols in the middle of the transmission period. In this way, the parts of the transmission subjected to interference may be protected. The data throughput may decrease due to the increased coding but the advantage is that the probability of lost data due to interference decreases.

The symbols requiring the stronger error correcting code may be coded with a (15,7) Reed-Solomon code and the rest of the symbols with a CRC (Cyclic Redundancy Check) code, for example.

In an embodiment, the symbols requiring the stronger error correcting code may be coded with a two m-bit burst error correcting code and the rest of the symbols with a one m-bit burst error correcting code. In another embodiment, the symbols requiring the stronger error correcting code may be coded with an m-bit burst error correcting code and the rest of the symbols with an n-bit burst error correcting code, where m>n.

As the number of available codes is large, one skilled in the art understands that the mentioned codes are merely illustrative examples of possible codes and that embodiments of the invention are not limited to the codes mentioned.

In an embodiment, the apparatus comprises an estimator 308. The estimator 308 may be configured to estimate the length of a first interfered period at the beginning of a transmission period. The estimator may be configured to estimate the length of a second interfered period at the end of a transmission period and inform the coder about the interfered periods.

The estimator 308 may be further configured to select the first given number of symbols on the basis of the length of the first interfering period and the length of the symbols. In addition, the estimator may be configured to select the second given number of symbols on the basis of the length of the second interfering period and the length of the symbols.

The estimator 308 provides the coder 302 with the estimated information.

In the example of FIG. 4, the first given number of symbols corresponds to three symbols and the second given number of symbols corresponds to two symbols.

The maximum clock error caused by clock inaccuracy $E_i$ can be estimated beforehand based on clock specifications used in base stations. The distances d, $d_i$ and respectively $D_i$ change as user equipment is moving. However, the distance values stay within known maximum values (which depend on cell sizes). Thus, $D_i$ may be predefined to a maximum value in order to reduce the real-time calculation.

Referring to the example of FIGS. 1 and 2, the length of the transmission period 400 may correspond to the high power transmission of base station BS2 to the user equipment. The first interfering period 402 corresponds to T1D to T1'D and the second interfering period 404 corresponds to T3D to T2D.

Figure 5:
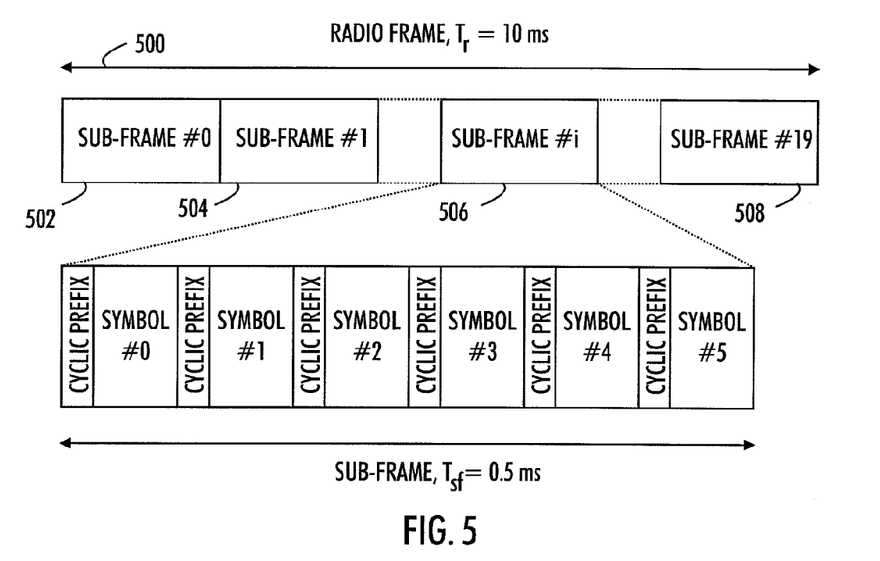
FIG. 5 illustrates another embodiment of the invention.

FIG. 5 illustrates another embodiment of the invention. In this embodiment, the coding solution is employed in a system utilizing a transmission frame format of FIG. 5. The transmission period corresponds to a radio frame 500 having in this example a of length 10 ms. The actual length of the frame is not relevant regarding the embodiments of the invention. All numerical values mentioned in connection with this embodiment are merely illustrative examples. The radio frame comprises a set of successive frames 502 to 508. In this example, the number of successive frames is 20 and each frame is of length 0.5 ms. Each frame 502 to 508 comprises a number of symbols, in this example 5 symbols.

In an embodiment, Orthogonal Frequency Division Multiple Access (OFDMA) is utilized in transmission. In OFDMA, user resources may be allocated both in time (TDMA) and in frequency (FDMA) domain. In the frequency dimension, symbols can be multiplexed on different numbers of subcarriers. Subcarriers can also be reserved to transmit pilot, signaling and other kind of symbols. Multiplexing can also take place in the time dimension, at either OFDM symbol rate or a multiple of it. The five symbols in FIG. 5 can thus be ODFMA symbols.

In the example of FIG. 5, one or more symbols of the first frame 502 (or even the whole frame) may be coded with a strong error correcting code. Respectively, the last symbols of the last frame 508 (or even the whole frame) may be coded with a strong error correcting code.

In an embodiment, the transmission period is a multiple of the radio frame of FIG. 5. In such a case, one or more symbols of the first frame 502 (or even the whole frame) of the first radio frame may be coded with a strong error correcting code. Respectively, the last symbols of the last frame 508 (or even the whole frame) of the last radio frame may be coded with a strong error correcting code.

In an embodiment of the invention, the invention is applied to base stations of a communication system, such as base stations BS1, BS2 and BS3 of FIG. 1. The base stations may utilize power sequence controlled transmission. In an embodiment, the power sequences used in adjacent base stations are different, and at any time instant, there is only one base station among adjacent base stations transmitting at the highest power level. In addition, a base station may be configured to use the highest power level with user equipment only when the user equipment is near the edges of the coverage area of the base station. The location or the distance of the user equipment from the base station may be determined on the basis of reported channel quality indicator (CQI), signal to interference ratio (SIR), path loss, or some other parameter or measurement. Generally, CQI reports poorer values the farther away from base station the user equipment is located. The same applies to SIR and path loss as well. In addition, other known methods may be utilized when determining the distances d, and $d_i$ between user equipment and base stations. For example, the location of the user equipment may be determined using a satellite positioning system.

In modern communication systems, $d_i$-d is within 300 meters for micro cells, and 1000 meters for small macro cells. Thus, the delay variation $D_i$ defined by equation 1 is usually within 1 to 4 microseconds. With a proper design, the clock inaccuracy between adjacent base stations $E_i$ can be assumed to be within a few microseconds. Thus, in an OFDMA system utilizing power sequence controlled transmission, only the first symbol in the first OFDM frame after power transition and the last symbol of the last OFDM frame transmitted during the highest power level need to be protected with a strong error correcting code.

In an embodiment, the user equipment is informed about the coding selected at the base station. Information about the coding may be transmitted on a control channel or it may be embedded in the transmitted signal. It may be embedded in an allocation table, which may be included in the transmitted frames.

In an embodiment, depending on the estimated SIR of each mobile receiver, a base station applies the stronger error correcting code only to OFDMA symbols intended to mobile receivers located farther away from the base station than a given threshold distance. For example, the stronger coding may be applied only to the symbols intended to mobile receivers located near the edge of the coverage area of the base station. Other OFDMA symbols intended to mobile receivers nearer the base station use normal error correcting codes.

Figure 6:
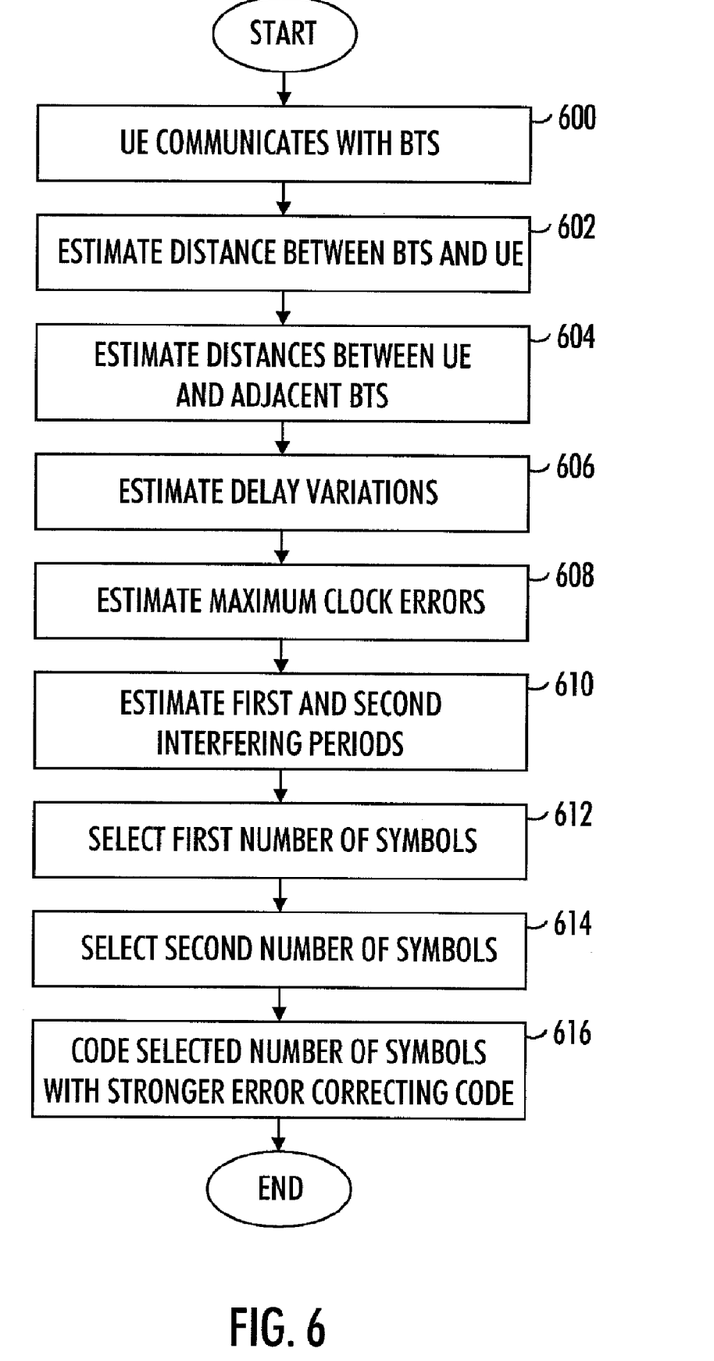
FIG. 6 illustrates an embodiment of the invention with a flowchart.

FIG. 6 illustrates an embodiment of the invention with a flow chart, using the system of FIG. 1 as an example configuration.

In step 600, a user terminal communicates with base station BS2 on a given frequency band. Adjacent base stations BS1, BS3 communicate on the same frequency band. The transmission power of the adjacent base stations BS1, BS2, BS3 is controlled according to power sequences in such a manner that only one base station of the adjacent base stations using the same frequency is transmitting at a high power level at any given time.

In step 602, the distance d between user equipment and base station BS2 is estimated.

In step 604, the distances $d_1$ and $d_3$ between the user equipment and base stations BS1 and BS3 are estimated.

In step 606, delay variations $D_1$, $D_3$ for connections between the user equipment and the interfering base stations BS1, BS3 are estimated on the basis of the estimated distances. Equation 1 may be utilized, for example. Thus, $D_1 = (d_1-d)/300$ and $D_3 = (d_3-d)/300$. As $d_1 > d$ and $d_3 > d$, the obtained values are positive.

In step 608, maximum clock errors $E_1$, $E_3$ for connections between the user equipment and the interfering base stations BS1, BS3 caused by clock inaccuracy between the desired base station BS2 and the interfering base stations BS1, BS3 are estimated. The maximum clock errors caused by clock inaccuracy can be estimated on the basis of clock specifications used in the base stations, for example. In addition, a pre-selected estimate may be used.

In step 610, the first and second interfering periods are estimated on the basis of the delay variations and the maximum clock errors. Equations 2 and 3 may be utilized, for example. Thus, the maximum length for the first interfering period is $ISmax = max\{(E_1+D_1), (E_3+D_3)\}$. The maximum length for the second interfering period is $IEmax = max\{(E_1-D_1), (E_3-D_3)\}$.

In step 612, a first given number of symbols at the beginning of a transmission period is selected the basis of the length of the first interfering period and the length of the symbols. The number is selected such that the total length of the selected symbols is equal to or longer than the length of the first interfering period.

In step 614, a second given number of symbols at the end of a transmission period is selected on the basis of the length of the second interfering period and the length of the symbols. The number is selected such that the total length of the selected symbols is equal to or longer than the length of the second interfering period.

In step 616, the first given number of symbols from the beginning of a transmission period and the second given number of symbols from the end of the transmission period are coded with a stronger error correcting code than the rest of the symbols in the transmission period.

In an embodiment of the invention, the stronger coding is applied only at either end of the transmission period.

Figure 7:
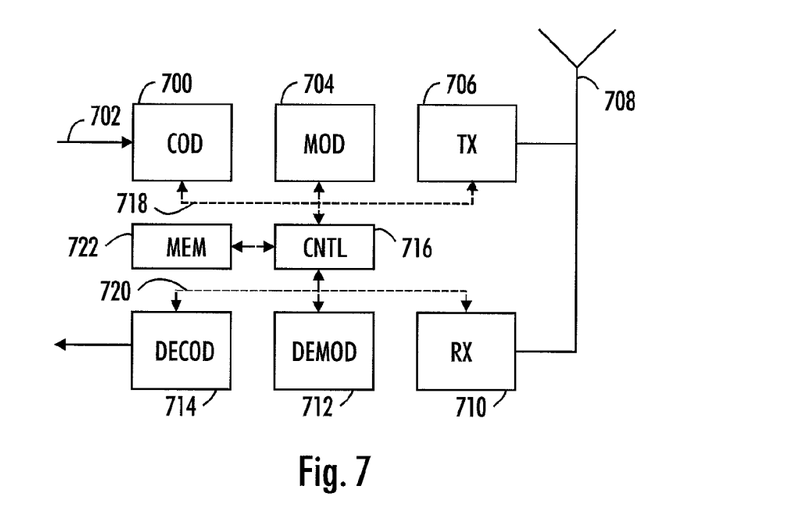
FIG. 7 illustrates an example of the structure of a base station and user equipment and FIG. 8 illustrates an embodiment of the invention with a flowchart.

FIG. 7 illustrates an example of the structure of a base station where embodiments of the invention may be applied. The base station comprises a coder 700 which is configured to code the signal 702 to be transmitted. The coding may comprise error correcting coding and other type of coding. The coded signal is taken to a modulator 704, where the coded signal is modulated. The modulator may be an ODFMA modulator, for example. The modulated signal is taken to a transmitter 706, which transmits the signal using an antenna 708. The base station may comprise a receiver 710 configured to receive a signal from user equipment. The received signal is taken to a demodulator 712 and a decoder 714.

The base station transmits a signal using transmission periods. The base station comprises a controller 716 configured to control the operation of the units of the base station using control buses 718, 720. The transmission of the base station may utilize a frame format. In such a case, the transmission period may comprise a set of successive frames.

The coder 700 is configured to code a first given number of symbols from the beginning of a transmission period with a stronger error correcting code than the rest of the symbols in the transmission period. Respectively, the coder may be configured to code a second given number of symbols from the end of the transmission period with a stronger error correcting code than the rest of the symbols in the transmission period.

The controller 716 of the base station may control the coder 700 and determine the first and second numbers as described above. The controller may be configured to determine the distance between the user equipment and the base station and the user equipment and one or more interfering base station, a delay variation for each connection between the user equipment and the interfering base station on the basis of the estimated distances, a maximum clock error for each connection between the user equipment and the interfering base station caused by clock inaccuracy between the base station and the interfering base stations, and estimate the first and second interfering periods on the basis of the delay variation and the maximum clock error.

The coder 700 and the controller 716 may be realized as one or more processors and associated software modules. The base station may comprise a memory 722 connected to the controller 716. The controller may store calculated and received data and software modules in the memory.

When embodiments of the invention are applied to user equipment, the structure of the user equipment is essentially the same as described above in connection with a base station.

In an embodiment, a base station may refrain from transmitting for ISmax microseconds and/or IEmax microseconds after the power transition and before another transition. In an embodiment, a guard time is extended by (ISmax+IEmax) microseconds during power transition.

Figure 8:
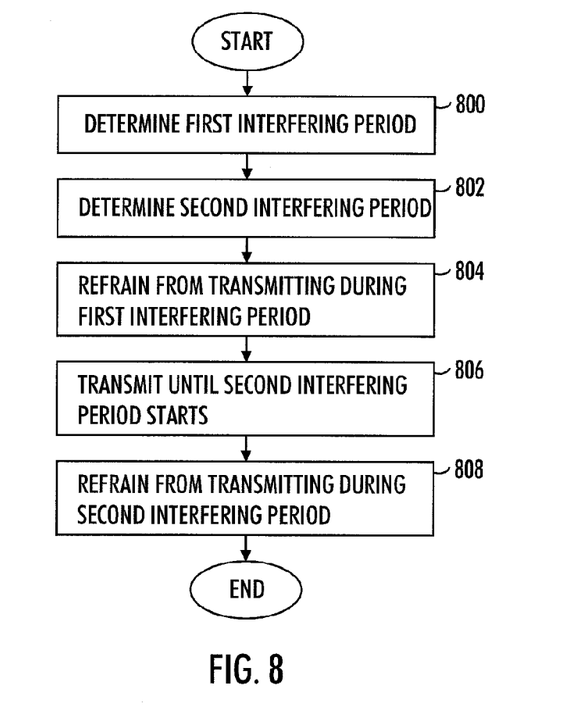

FIG. 8 illustrates an embodiment of the invention with a flow chart. In step 800, a first interfering period ISmax at the beginning of power level transition is determined. It may be calculated as in the flowchart of FIG. 6 or it may be predetermined to a given fixed value.

In step 802, a second interfering period IEmax at the end of power level transition is determined. It may be calculated as in the flowchart of FIG. 6 or it may be predetermined to a given fixed value.

In step 804, the transmitter refrains from transmitting any symbols during the first interfering period.

In step 806, the first interfering period ends and the transmitter begins transmission until the second interfering period starts.

In step 808, the transmitter refrains from transmitting any symbols during the second interfering period.

In an embodiment, only one of the steps 804, 808 is performed.

Embodiments of the invention may be realized in an electronic device, comprising a coder and a controller operationally connected to the coder. The coder and controller may be configured to perform at least some of the steps described in connection with the flowchart of FIG. 6 and in connection with FIGS. 1 to 5 and 7. The embodiments may be implemented as a computer program comprising instructions for executing a computer process for coding a signal, the signal comprising symbols, the process comprising: coding at least one of the following: a first given number of symbols from the beginning of a transmission period, a second given number of symbols from the end of the transmission period with a stronger error correcting code than the rest of the symbols in the transmission period.

The computer program may be stored on a computer program distribution medium readable by a computer or a processor. The computer program medium may be, for example but not limited to, an electric, magnetic, optical, infrared or semiconductor system, device or transmission medium. The computer program medium may include at least one of the following media: a computer readable medium, a program storage medium, a record medium, a computer readable memory, a random access memory, an erasable programmable read-only memory, a computer readable software distribution package, a computer readable signal, a computer readable telecommunications signal, computer readable printed matter, and a computer readable compressed software package.

Even though the invention has been described above with reference to an example according to the accompanying drawings, it is clear that the invention is not restricted thereto but it can be modified in several ways within the scope of the appended claims.

What is claimed is:

1. A method, comprising:
estimating a length of a first interfered period at the beginning of a transmission period, and a length of a second interfered period at the end of the transmission period;
coding a first given number of symbols from the beginning of the transmission period, and a second given number of symbols from the end of the transmission period; with a stronger error correcting code than the rest of the symbols in the transmission period.

2. The method of claim 1, further comprising:
estimating the length of the first interfered period at the beginning of the transmission period, wherein the transmission period comprises one or more successive frames, and
selecting the first given number on the basis of the length of the first interfered period and the length of the symbols.

3. The method of claim 2, further comprising:
estimating the length of the second interfered period at the end of the transmission period, wherein the transmission period comprises one or more successive frames, and
selecting the second given number on the basis of the length of the second interfered period and the length of the symbols.

4. The method of claim 1, further comprising:
estimating the distance between a receiver and a desired transmitter and the receiver and one or more interfering transmitters,
determining a delay variation for each connection between the receiver and the interfering transmitters on the basis of the estimated distances, estimating a maximum clock error for each connection between the receiver and the interfering transmitters caused by clock inaccuracy between the desired transmitter and the interfering transmitters, and
estimating the first and second interfered periods on the basis of the delay variation and the maximum clock error.

5. The method of claim 4, further comprising:
estimating the first interfered period as the maximum value of a sum of the maximum clock error and the delay variation over each connection between the receiver and the interfering transmitters.

6. The method of claim 4, further comprising:
estimating the second interfered period as the maximum value of the difference of the maximum clock error and the delay variation over each connection between the receiver and the interfering transmitters.

7. The method of claim 4, further comprising:
applying the stronger error correcting code only if the distance between the receiver and the desired transmitter is larger than a given threshold.

8. The method of claim 4, further comprising:
determining a SIR estimate for receivers,
applying the stronger error correcting code only to symbols intended to receivers located farther away from the desired transmitter than a given threshold distance and having a SIR estimate below a given threshold.

9. An apparatus, comprising:
an estimator configured to estimate a length of a first interfered period at the beginning of a transmission period, and a length of a second interfered period at the end of the transmission period; and
a coder coupled to the estimator and configured to code a first given number of symbols from the beginning of the transmission period, and a second given number of symbols from the end of the transmission period with a stronger error correcting code than the rest of the symbols in the transmission period.

10. The apparatus of claim 9, wherein:
the coder is configured to code at least one of: the first given number of symbols from the beginning of a first frame in a set of successive frames, or the second given number of symbols from the end of the last frame of the set of successive frames; with a stronger error correcting code than the rest of the symbols in the set of successive frames.

11. The apparatus of claim 9, further comprising:
a controller configured to select the first given number on the basis of the length of the first interfered period and the length of the symbols.

12. The apparatus of claim 9, further comprising:
a controller configured to estimate the length of the second interfered period at the end of the transmission period, wherein the transmission period comprises one or more successive frames, and
select the second given number on the basis of the length of the second interfered period and the length of the symbols.

13. The apparatus of claim 9, further comprising a controller configured to:
estimate the distance between a receiver and a desired transmitter and the receiver and one or more interfering transmitters,
determine a delay variation for each connection between the receiver and the interfering transmitters on the basis of the estimated distances,
estimate a maximum clock error for each connection between the receiver and the interfering transmitters caused by clock inaccuracy between the desired transmitter and the interfering transmitters, and
estimate the first and second interfered periods on the basis of the delay variation and the maximum clock error.

14. The apparatus of claim 9, wherein the coder accepts as an input a signal information regarding the first given number of symbols and the second given number of symbols.

15. An integrated circuit, comprising:
an estimator configured to estimate a length of a first interfered period at the beginning of a transmission period, and a length of a second interfered period at the end of the transmission period; and
a coder coupled to the estimator and configured to code a a first given number of symbols from the beginning of the transmission period, and a second given number of symbols from the end of the transmission period with a stronger error correcting code than the rest of the symbols in the transmission period.

16. A computer program product stored in a non-transitory computer readable medium that stores a computer program of instructions for executing a computer process for coding a signal, the signal comprising symbols, the process comprising:
estimating a length of a first interfered period at the beginning of a transmission period, and a length of a second interfered period at the end of the transmission period; and
coding a first given number of symbols from the beginning of the transmission period, and a second given number of symbols from the end of the transmission period; with a stronger error correcting code than the rest of the symbols in the transmission period.

* * * * *